United States Patent
Bruce et al.

(10) Patent No.: US 10,892,413 B2
(45) Date of Patent: Jan. 12, 2021

(54) INTEGRATION OF CONFINED PHASE CHANGE MEMORY WITH THRESHOLD SWITCHING MATERIAL

(71) Applicant: International Business Machines Corporation, Armonk, NY (US)

(72) Inventors: Robert L. Bruce, White Plains, NY (US); Fabio Carta, White Plains, NY (US); Wanki Kim, Westchester, NY (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/408,392

(22) Filed: Jan. 17, 2017

(65) Prior Publication Data
US 2018/0205017 A1 Jul. 19, 2018

(51) Int. Cl.
*H01L 45/00* (2006.01)
*H01L 27/24* (2006.01)

(52) U.S. Cl.
CPC ...... *H01L 45/1683* (2013.01); *H01L 27/2409* (2013.01); *H01L 27/2427* (2013.01); *H01L 27/2481* (2013.01); *H01L 45/06* (2013.01); *H01L 45/1233* (2013.01); *H01L 45/1293* (2013.01); *H01L 45/144* (2013.01)

(58) Field of Classification Search
CPC .............. H01L 45/1683; H01L 45/144; H01L 27/2481; H01L 45/1253; H01L 45/06; H01L 45/1233
See application file for complete search history.

(56) References Cited

U.S. PATENT DOCUMENTS

| | | | |
|---|---|---|---|
| 2008/0164454 A1* | 7/2008 | Chen | H01L 27/2409 257/4 |
| 2009/0057642 A1* | 3/2009 | Sargent | H01L 45/06 257/4 |
| 2010/0163817 A1* | 7/2010 | Savransky | H01L 27/2427 257/2 |

(Continued)

OTHER PUBLICATIONS

Kim et al., (Dec. 2013). A Phase change Memory Cell with Metallic Surfactant Layer as a Resistance Drift Stabilizer, 2013 IEEE International Electron Devices Meeting. Washington D.C. (Year: 2013).*

(Continued)

*Primary Examiner* — Jerome Leboeuf
(74) *Attorney, Agent, or Firm* — Ido Tuchman; Erik K. Johnson

(57) ABSTRACT

A phase change memory array and method for fabricating the same. The phase change memory array includes a plurality of bottom electrodes, top electrodes, and memory pillars. Each of the memory pillars includes phase change material surrounded by a dielectric casing. The phase change material is positioned between, and in series circuit with, a respective bottom electrode from the bottom electrodes and a respective top electrode from the top electrodes. A continuous layer of selector material is positioned between the memory pillars and the plurality of bottom electrodes. The selector material is configured to conduct electricity only when a voltage across the selector material exceeds a voltage threshold.

19 Claims, 8 Drawing Sheets

(56) References Cited

U.S. PATENT DOCUMENTS

| | | | | |
|---|---|---|---|---|
| 2011/0317481 A1* | 12/2011 | Franceschini | ............ | G11C 8/10 |
| | | | | 365/163 |
| 2013/0015421 A1* | 1/2013 | Sim | ........................ | H01L 45/06 |
| | | | | 257/2 |
| 2015/0243884 A1* | 8/2015 | BrightSky | ............... | H01L 45/06 |
| | | | | 257/4 |
| 2015/0357564 A1* | 12/2015 | Van Gerpen | ............ | H01L 45/06 |
| | | | | 257/4 |

OTHER PUBLICATIONS

Sungho Kim et al., "Performance of Threshold Switching in Chalcogenide Glass for 3D Stackable Selector," 2013 Symposium on VLSI Technology Digest of Technical Papers, pp. T240-T241 (2013).
S.H. Lee et al., "Highly scalable non-volatile and ultra-low-power phase-change nanowire memory," Nature Nanotechnology, vol. 2, pp. 626-630 (2007).
A. Pirovano et al., "Scaling analysis of phase-change memory technology," IEDM, pp. 1-4 (2003).
S. Kim et al., "A Phase Change Memory Cell with Metallic Surfactant Layer as a Resistance Drift Stabilizer," IEDM, pp. 1-4 (2013).

\* cited by examiner

INTEGRATION OF CONFINED PHASE CHANGE MEMORY WITH THRESHOLD SWITCHING MATERIAL

BACKGROUND

The present invention is directed toward computer memory, and more particularly to a resistive memory device design and method for fabricating a resistive memory device.

There are two major groups in computer memory: non-volatile memory and volatile memory. Constant input of energy in order to retain information is not necessary in non-volatile memory but is required in the volatile memory. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM); non-volatile memory devices being memory in which the state of the memory elements can be retained for days to decades without power consumption. Examples of volatile memory devices include Dynamic Random Access Memory (DRAM) and Static Random Access Memory (SRAM); where DRAM requires the memory element to be constantly refreshed while SRAM requires a constant supply of energy to maintain the state of the memory element.

With phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common semiconductors in the group used to produce a chalcogenide when creating a phase change memory cell. An example of this would be $Ge_2Sb_2Te_5$ (GST), SbTe, and $In_2Se_3$.

The heat necessary to drive a change between states in the phase change material propagates to adjacent materials. Heat propagating into adjacent memory cells may cause thermal cross-talk and errors in bit storage.

Phase change memory cell designs also attempt to minimize the area of each cell in order to maximize the density of the memory arrays. As the density increases, neighboring PCM cells become closer and closer and heat propagation into adjacent memory cells become a concern. Thus, it is desirable to keep heat away from the adjacent memory cells.

BRIEF SUMMARY

Accordingly, aspects of the present invention include a 1-selector 1-resistor (1S1R) memory structure with confined PCM. The confined PCM fabrication process disclosed can beneficially minimize damage resulting from etching phase change material and selector material, and reduce thermal cross-talk between adjacent memory cells.

One example aspect of the present invention is a phase change memory array. The phase change memory array includes a plurality of bottom electrodes, top electrodes, and memory pillars. Each of the memory pillars includes phase change material surrounded by a dielectric casing. The phase change material is positioned between, and in series circuit with, a respective bottom electrode from the bottom electrodes and a respective top electrode from the top electrodes. A continuous layer of selector material is positioned between the memory pillars and the plurality of bottom electrodes. The selector material is configured to conduct electricity only when a voltage across the selector material exceeds a voltage threshold.

Another example aspect of the present invention is a method for fabricating a phase change memory array. The method includes forming a plurality of bottom electrodes. A depositing operation deposits selector material in a continuous layer above and in contact with the bottom electrodes. The selector material configured to conduct electricity only when a voltage across the selector material exceeds a voltage threshold. A forming operation forms a plurality of memory pillars within a sacrificial dielectric layer above the selector material. Each of the memory pillars includes phase change material surrounded by a dielectric casing. The phase change material is positioned between, and in series circuit with, a respective bottom electrode from the bottom electrodes and the selector material. A removing operation removes the sacrificial dielectric layer while maintaining the memory pillars and the continuous layer of selective material. A forming operation forms a plurality of top electrodes above the memory pillars. The top electrodes are electrically connected to the memory pillars.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
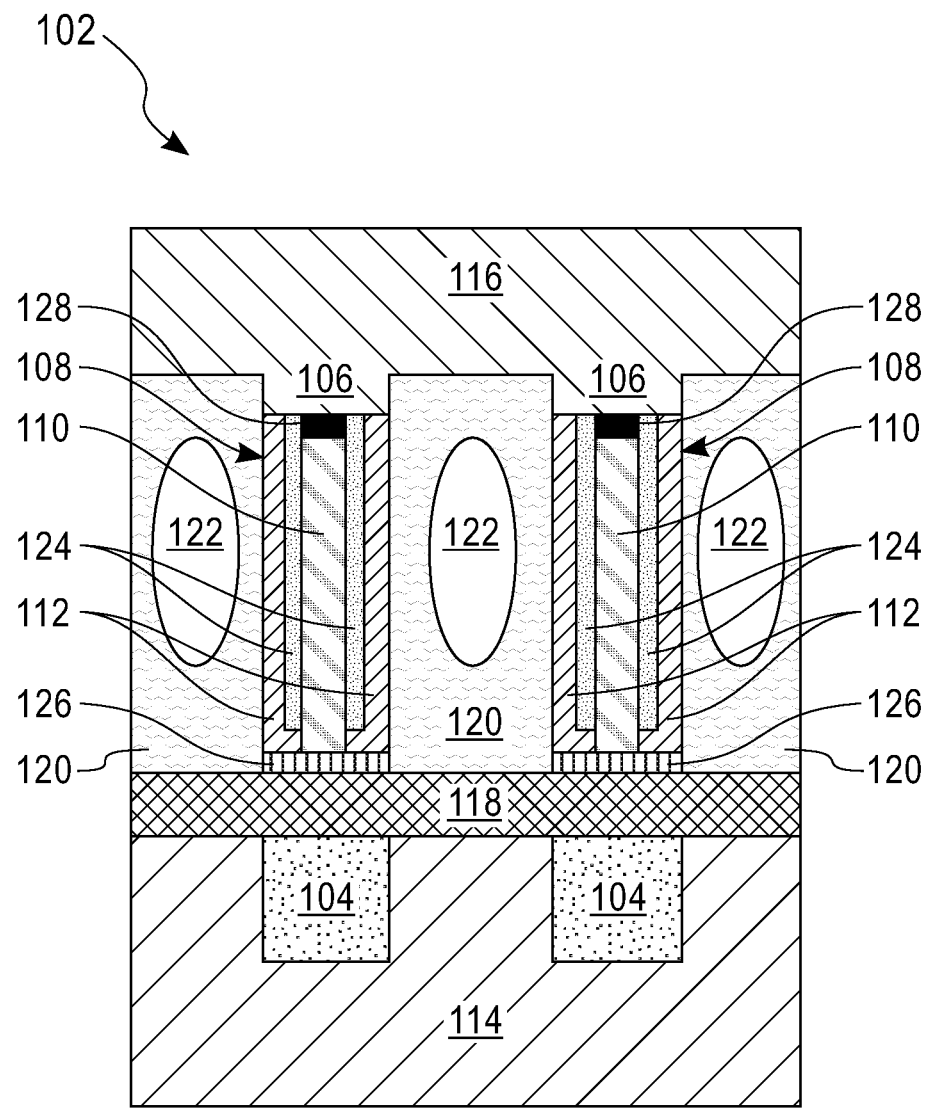
FIG. 1 shows an example phase change memory array 102 contemplated by the present invention.

The present invention is described with reference to embodiments of the invention. Throughout the description of the invention reference is made to FIGS. 1-13. When referring to the figures, like structures and elements shown throughout are indicated with like reference numerals.

A feature of an embodiment of the present invention is an integration process for a one-selector one-resistor (1S1R) memory structure with confined PCM. As described in detail below, this confined PCM exhibits an etch-free sidewall fabrication process that reduces or eliminates etch damages to the phase change material and the selector material. Embodiments of the present invention may also help reduce thermal cross-talk between adjacent memory cells.

FIG. 1 shows an example phase change memory array 102 contemplated by the present invention. The array 102 includes a row of bottom electrodes 104, a row of top electrodes 106, and a row of memory pillars 108. Each of the memory pillars 108 includes phase change material 110 surrounded by a dielectric casing 112. The phase change material 110 is positioned between, and in series circuit with, a respective bottom electrode from the plurality of bottom electrodes 104, and a respective top electrode from the plurality of top electrodes 106.

The phase change material is selectively settable to at least two states having different electrical resistivity. In a single-level cell (SLC), the phase change material is programmable to one of two different resistance levels. For example, the phase change material may be a material selectively configurable to either a first phase having a first electrical resistance or a second phase having a second electrical resistance, where the first electrical resistance is greater than the second electrical resistance. The phase change material is generally defined as any material which shows phase change caused by joule heating. In one embodiment, the phase change material may include a Germanium-Antimony-Tellurium (GST) compound, such as $Ge_2Sb_2Te_5$. Other phase change materials, such as SbTe and $In_2Se_3$, may also be used by the present invention. In one embodiment, the phase change memory array is a multi-bit memory array. Thus, the phase change material is programmed to one of at least three resistance levels for a multi-level cell (MLC)

The array 102 includes a dielectric substrate 114 in which the bottom electrodes 104 are formed. In one embodiment, the dielectric substrate 114 is silicon oxide, and the bottom electrodes 104 and top electrodes 106 are made of a conductive material, such as titanium nitride (TiN), tungsten (W) or polycrystalline silicon. The top electrodes 106 may be electrically connected to a bit line 116 in the array 102.

The array 102 includes a continuous layer of selector material 118 positioned between the memory pillars 108 and the bottom electrodes 104. Thus, the continuous layer of the selector material 118 is in physical contact with each of the bottom electrodes 104 and each of the memory pillars 108. The selector material 118 is configured to conduct electricity only when a voltage across the selector material exceeds a voltage threshold. In one embodiment, the selector material is an AsTeGeSiN-based material. It is contemplated that other selector devices, such as a bidirectional varistor, CRS, MIEC, and Schottky diode may be used in embodiments of the present invention.

In one embodiment, the array 102 includes an insulating dielectric layer 120 which surrounds all memory pillars 108. The insulating dielectric layer 120 includes central cavities 122. The central cavity 122 in the insulating dielectric layer 120 helps minimize thermal cross-talk due to an extremely low thermal conductivity of air gaps.

In one embodiment, each of the memory pillars 108 includes a metallic liner 124 positioned between and in contact with the dielectric casing 112 and the phase change material 110 along a portion of the memory pillars 108. The metallic liner 124 of each of the memory pillars 108 may be in physical contact with a respective top electrode 106.

The phase change material 110 of each of the memory pillars 108 is electrically connected to the selector material 118 at the bottom of a respective memory pillar 108. In one embodiment, each of the memory pillars 108 includes a bottom metallic layer 126 positioned between and in physical contact with the phase change material 110 and the selector material 118.

In one embodiment, each of the memory pillars 108 includes a top metallic layer 128 positioned between and in physical contact with the phase change material 110 and a respective top electrode 106.

Figure 2:
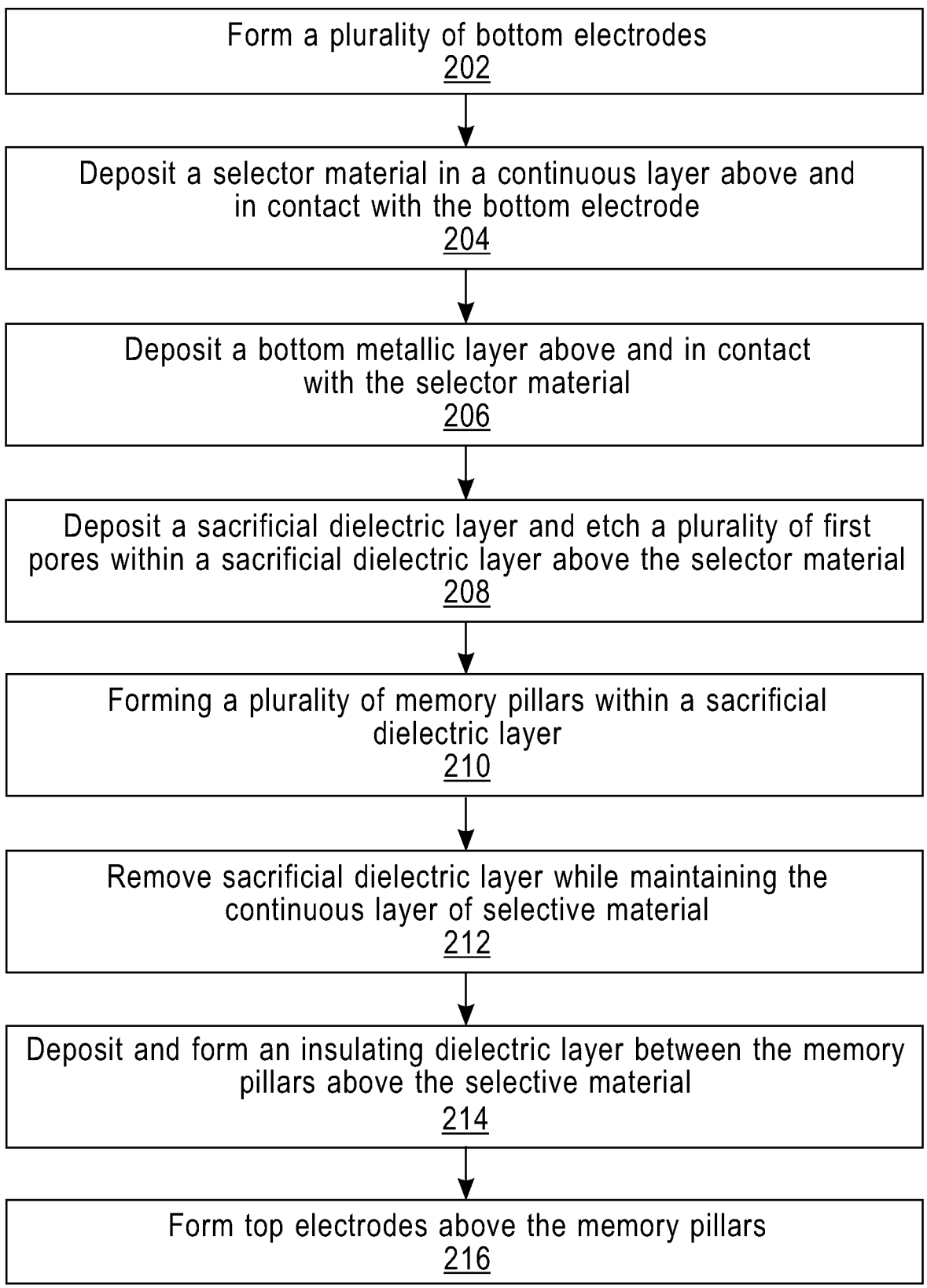
FIG. 2 shows an example process for fabricating a phase change memory array contemplated by the present invention.
Figure 3:
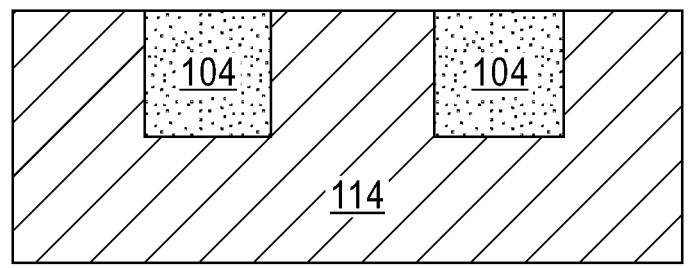
FIG. 3 illustrates the formation of bottom electrodes in the dielectric substrate.

FIG. 2 shows an example process for fabricating a phase change memory array contemplated by the present invention. The method includes forming operation 202. During the forming operation 202, bottom electrodes are formed in a dielectric substrate. FIG. 3 illustrates the formation of bottom electrodes 104 in the dielectric substrate 114. Returning to FIG. 2, after forming operation 202 is completed, the process continues to depositing operation 204.

At depositing operation 204, a selector material is deposited in a continuous layer above and in contact with the bottom electrodes. As discussed above, the selector material is configured to conduct electricity only when a voltage across the selector material exceeds a voltage threshold. After depositing operation 204 is completed, the process continues to depositing operation 206.

At depositing operation 206, a bottom metallic layer is deposited above and in contact with the selector material such that the bottom metallic layer is positioned between and in contact with the selector material and the sacrificial dielectric layer.

Figure 4:
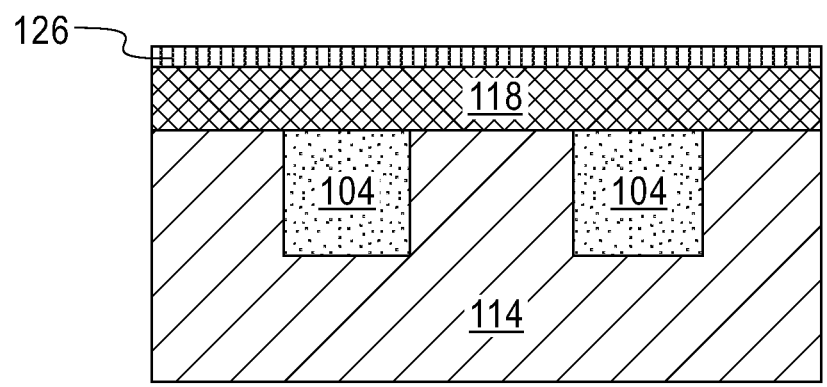
FIG. 4 illustrates the deposition of a selector material and a bottom metallic layer.

FIG. 4 illustrates the deposition of the selector material 118 and the bottom metallic layer 126. In one embodiment, the bottom metallic layer 126 is a metal nitride because it can be used as a good diffusion barrier between selector layer and PCM. Furthermore, the selector material 118 is not patterned. Thus, the selector material 118 is free from etching damage.

Figure 5:
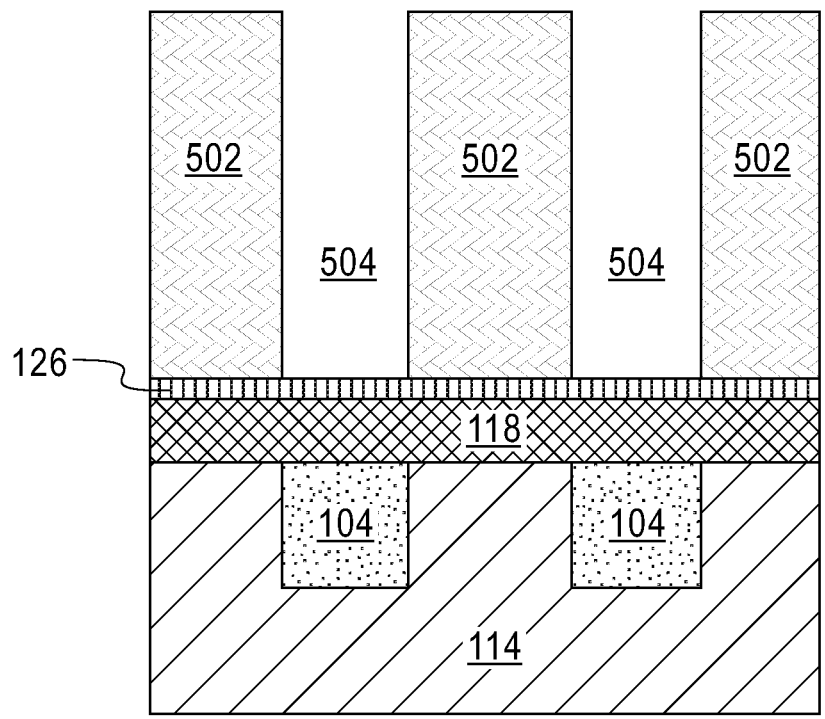
FIG. 5 illustrates the deposition and subsequent patterning of a sacrificial dielectric layer to form the first pores.

Returning to FIG. 2, at etching operation 208, a plurality of first pores are etched within a sacrificial dielectric layer above the selector material. FIG. 5 illustrates the deposition and subsequent patterning of the sacrificial dielectric layer 502 to form the first pores 504. In one embodiment, the sacrificial dielectric layer 502 is composed of silicon oxide ($SiO_2$) and patterned by a lithographic etch. At FIG. 2, after the etching operation 208 is completed, process flow continues to forming operation 210.

At forming operation 210, a plurality of memory pillars is formed within a sacrificial dielectric layer above the selector material. As discussed above, each of the memory pillars includes phase change material surrounded by a dielectric casing. Furthermore, the phase change material is positioned between, and in series circuit with, a respective bottom electrode from the plurality of bottom electrodes and the selector material. FIGS. 6-10 illustrate an example process flow for forming the memory pillars.

Figure 6:
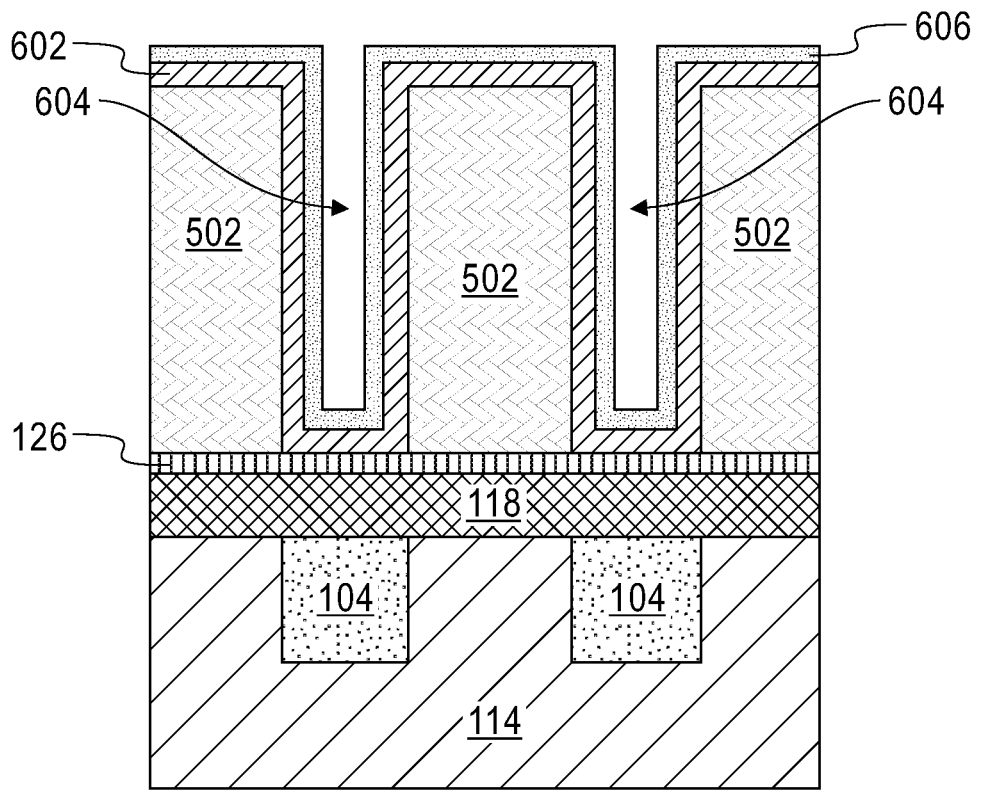
FIG. 6 shows a dielectric casing material deposited to form the dielectric casing within the first pores.

At FIG. 6, a dielectric casing material 602 is deposited to form the dielectric casing within the first pores. The dielectric casing material creates a plurality of second pores 604 with smaller volumes than the first pores. In one embodiment, the dielectric casing material 602 is composed of silicon nitride (SiN).

In addition to deposition of dielectric casing material 602, the process may include deposition of a metallic liner 606 within the second pore 604. This deposition causes the metallic liner 606 to be positioned between and in contact with the dielectric casing material 602 and, eventually, the phase change material along a portion of the memory pillars. The dielectric casing material 602 and the metallic liner 606 are continuous inside the pore. Thus, atomic layer deposition (ALD) or similar process may be used to deposit the two layers.

Figure 7:
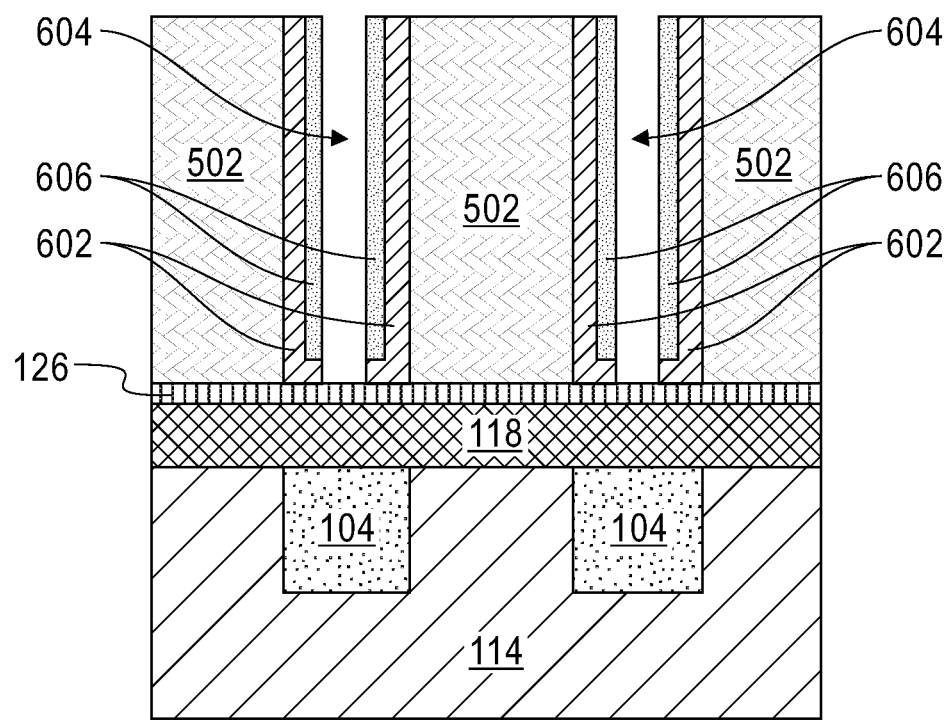
FIG. 7 shows etching of a dielectric casing material and a metallic liner.

FIG. 7 shows etching of the dielectric casing material 602 and the metallic liner 606. The dielectric casing material 602 and the metallic liner 606 are etched in the field and at a bottom of each of the second pores such that the phase change material is subsequently electrically connected to the selector material 118 (via the bottom metallic layer 126) at the bottom of each of the second pores 604.

Figure 8:
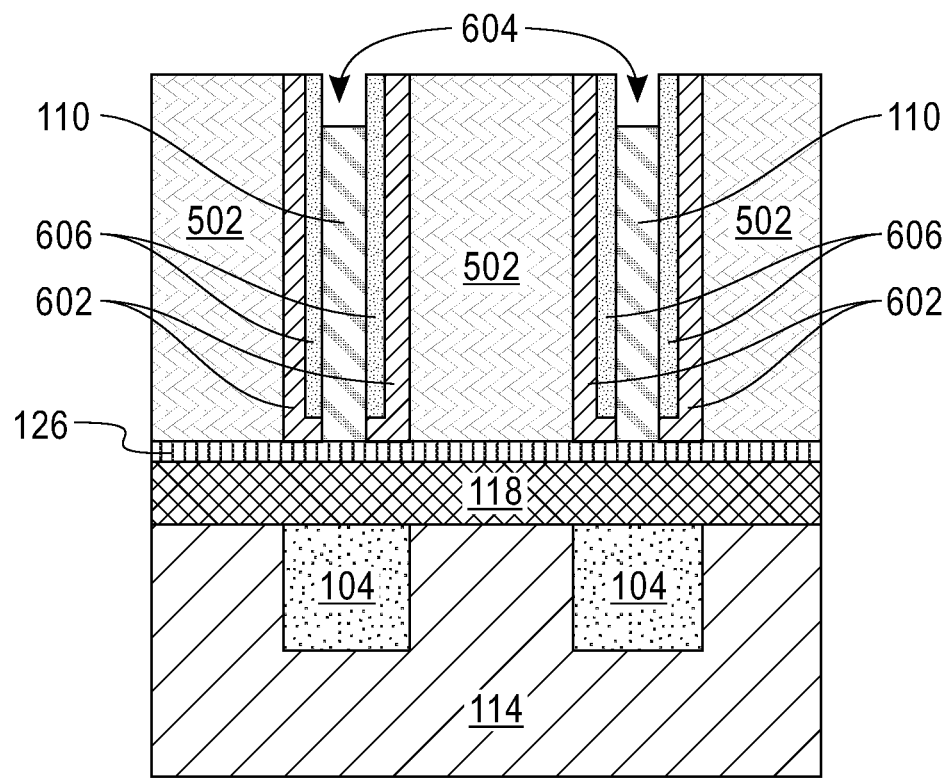
FIG. 8 shows deposition of a phase change material in the plurality of second pores.

FIG. 8 shows deposition of the phase change material 110 in the plurality of second pores 604. After depositing phase change material 110 inside the second pores 604, the phase change material 110 in the field is removed by the etch-back or chemical mechanical planarization (CMP) of the phase change material 110. In one embodiment, the phase change material 110 is deposited in second pores 604 by ALD deposition. The metallic liner inside the pore enables dense phase change material deposition inside pores with little or no voids.

Figure 9:
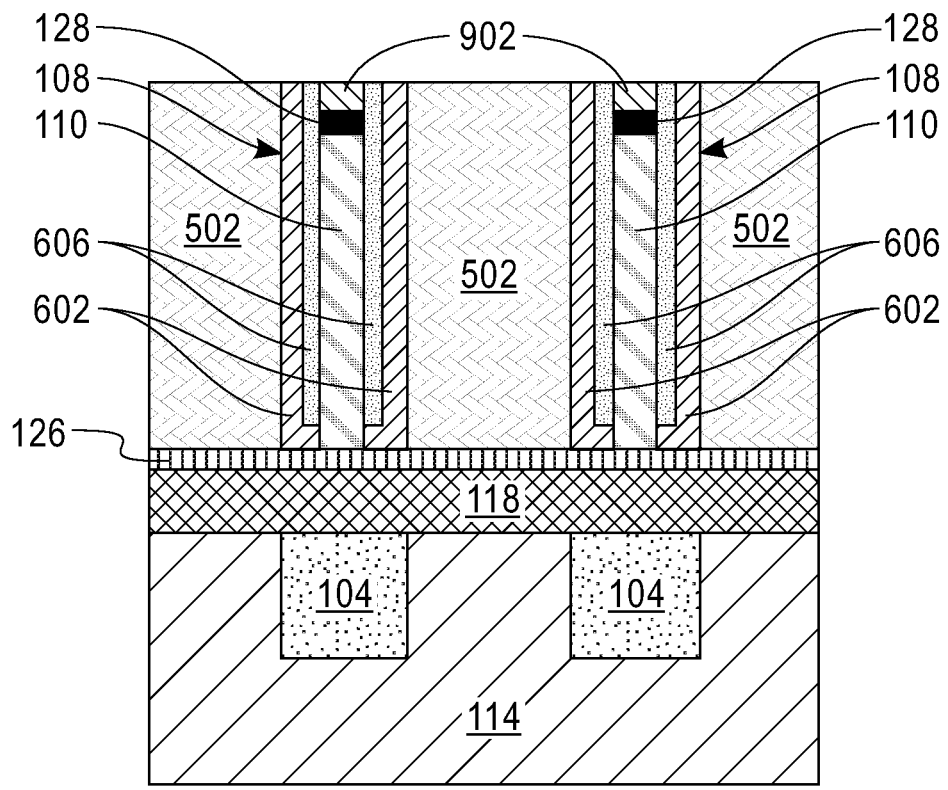
FIG. 9 shows deposition of a top metallic layer and dielectric top layer above the phase change material and within second pores.

FIG. 9 shows deposition of a top metallic layer 128 above the phase change material 110 and within the second pores. FIG. 9 also illustrates depositing a dielectric top layer 902 above the metallic top layer 128 and within the second pores. The figure shows both the deposition and etch-back of the top metallic layer 128 and the dielectric top layer 902. In one embodiment, the dielectric top layer 902 is composed of SiN. The dielectric top layer 902 is used to protect the top metallic layer 128 and phase change material 110 inside the pore during the subsequent etching of the sacrificial dielectric layer 502.

Returning to FIG. 2, at removing operation 212, the sacrificial dielectric layer is removed while the continuous layer of selective material is maintained. More particularly, the sacrificial dielectric layer is selectively etched without etching the phase change material and the selector material below the phase change material.

Figure 10:
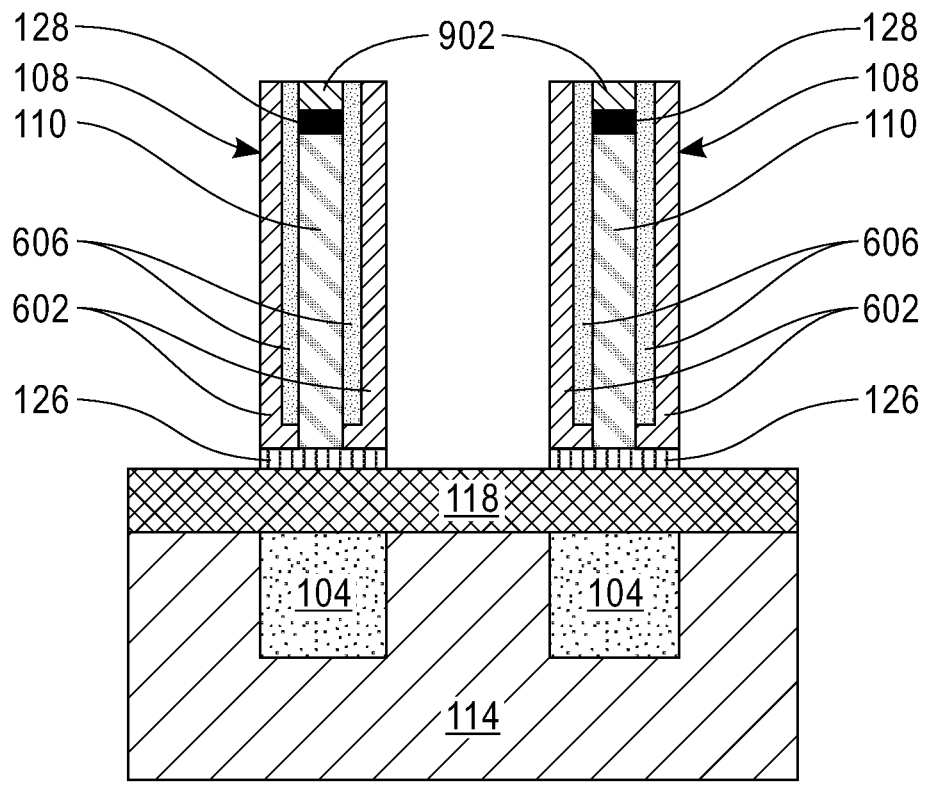
FIG. 10 shows the memory array with a sacrificial dielectric layer etched away.

FIG. 10 shows the memory array with the sacrificial dielectric layer etched away. Since the dielectric top layer 902 is positioned on top of the phase change material 110 and top metallic layer 128, the sacrificial dielectric layer surrounding the memory pillars 108 can be etched away without damaging the phase change material 110.

At FIG. 2, process flow continues to depositing operation 214. During depositing operation 214, an insulating dielectric layer is deposited between the memory pillars and above the continuous layer of selective material after removing the sacrificial dielectric layer. The insulating dielectric layer includes central cavities formed during deposition of the insulating dielectric layer.

Figure 11:
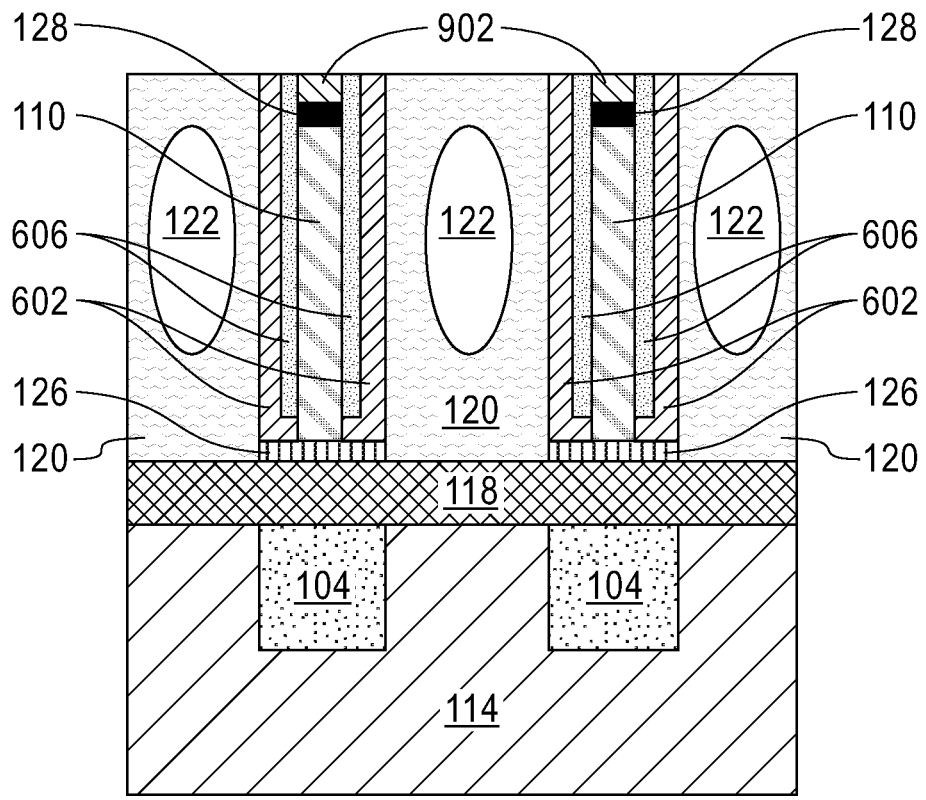
FIG. 11 shows deposition and etch-back of an insulating dielectric layer with air gaps.

FIG. 11 shows deposition and etch-back of the insulating dielectric layer 120. In one embodiment, the insulating dielectric layer 120 is deposited using physical vapor deposition (PVD). The insulating dielectric layer 120 is composed of a dielectric material, such as silicon oxide. After deposition, the insulating dielectric layer 120 in the field is removed by an etch-back process or chemical mechanical polishing (CMP). Because of high aspect ratio of the memory pillars 108 and short length between memory pillars 108, central cavities 122 are formed inside the insulating dielectric layer 120. The central cavities 122 beneficially reduce thermal cross-talk between memory pillars 108.

Figure 12:
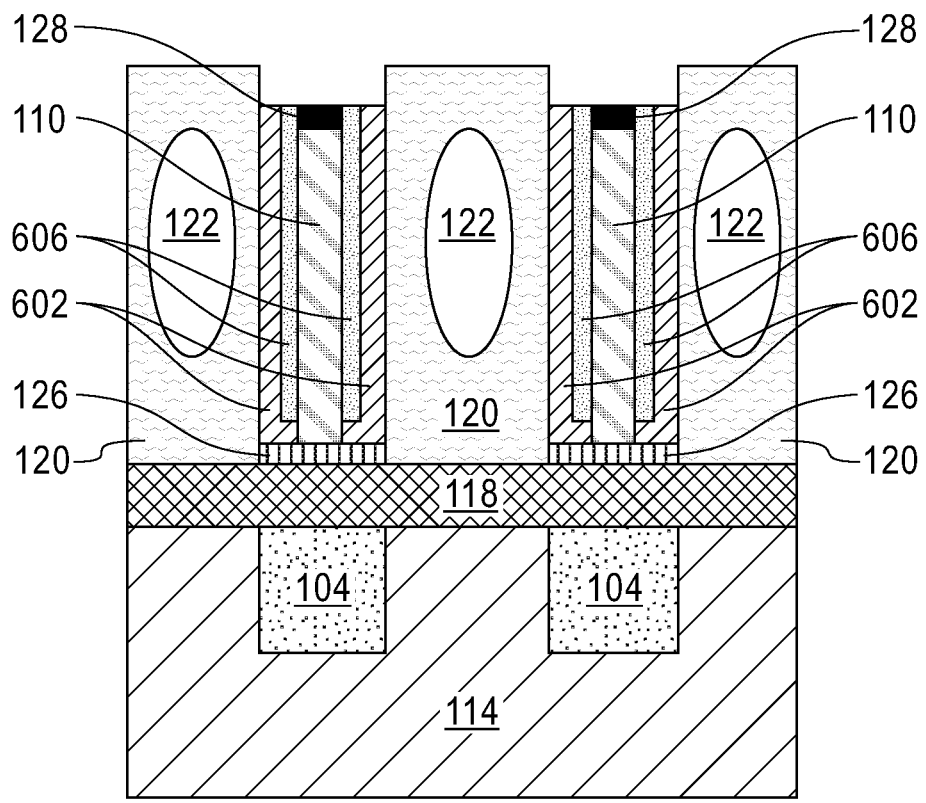
FIG. 12 shows the array structure with the dielectric top layer removed.

FIG. 12 shows the array structure with the dielectric top layer 902 removed. In one embodiment, the dielectric top layer 902 is removed using a nitride etch. Once the dielectric top layer 902 removed, the phase change material 110 can be electrically connected to top electrodes.

Returning to FIG. 2, process flow continues to forming operation 216. At forming operation 216, a plurality of top electrodes is formed above the memory pillars. The top electrodes are electrically connected to the memory pillars.

Figure 13:
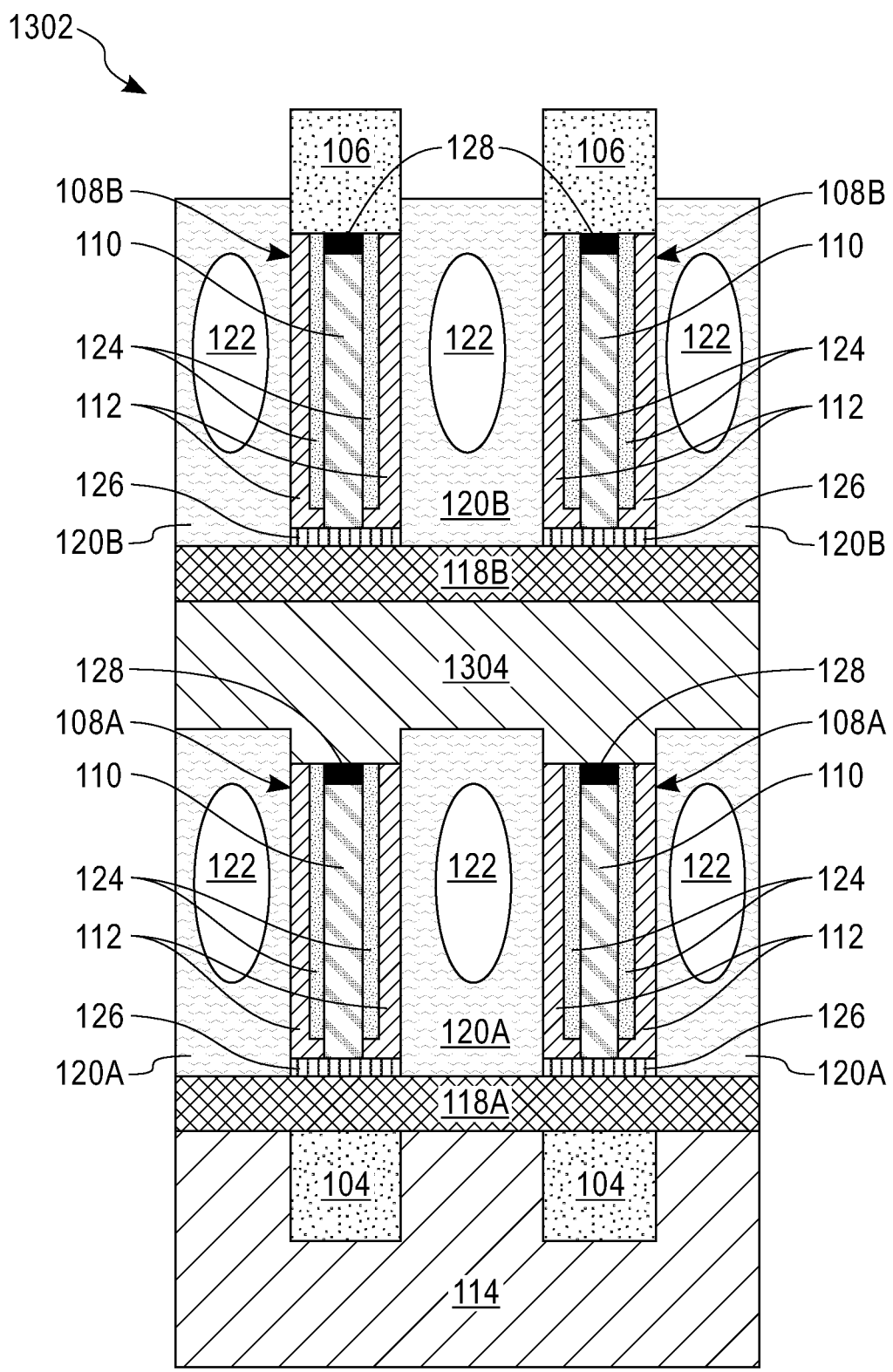
FIG. 13 shows an example three-dimensional stacked memory structure contemplated by the present invention.

FIG. 13 shows an example three-dimensional stacked memory structure 1302 contemplated by the present invention. The memory structure 1302 includes a plurality of bottom electrodes 104 formed in a dielectric substrate 114. A continuous first layer of selector material 118A is positioned between a first row of memory pillars 108A and the bottom electrodes 104. A first layer of insulating dielectric 120A is positioned between respective memory pillars 108A.

A plurality of middle electrodes 1304 function as top electrodes for the first row of memory pillars 108A and bottom electrodes for a second row of memory pillars 108B. A continuous second layer of selector material 118B is positioned between the second row of memory pillars 108B and the middle electrodes 1304. A second layer of insulating dielectric 120B is positioned between respective memory pillars 108B. A plurality of top electrodes 106 are electrically connected to the second row of memory pillars 108B.

As discussed in detail above, each of the memory pillars 108A and 108B includes a bottom metallic layer 126, a metallic liner 124 positioned between and in contact with a dielectric casing 112 and phase change material 110, a top metallic layer 128. Each of the insulating dielectric layers 120A and 120B includes central cavities 122.

Those skilled in the art will appreciate that the fabrication process described herein beneficially does not require etching of phase change material and threshold switching material during removal of the sacrificial dielectric layer. This process can prevent problems caused by etching phase change material and threshold switching material.

In addition, the dielectric casing surrounding the phase change material is used to protect the phase change material while etching the sacrificial dielectric layer. Furthermore, the dielectric casing can be used to decrease the volume of the pore receiving the phase change material.

Another beneficial feature of embodiments of the present invention may include an air gap in the insulating dielectric layer. The insulating dielectric layer can serve as a low-k dielectric due to almost zero dielectric constant of the air gap in the dielectric. Moreover, air gap in the insulating dielectric layer can minimize thermal cross-talk due to extremely low thermal conductivity of the air gaps.

Additionally, the metallic liner inside the pore mitigates resistance-drift. Therefore, the confined PCM with a metallic liner can store multi-bits in a single cell. This confined PCM with a metallic liner can function as a multi-level cell (MLC) such that the phase change material is programmable to one of at least three resistance levels.

The 1S1R structure can be used in the integration of 3D cross-point structure. Therefore, the 1S1R structure has a high potential to be incorporated into a high-density storage class memory (SCM) because of its fabrication process free from etching damage, low thermal cross-talk, mitigated resistance-drift and excellent scalability.

As described above, embodiments of the present invention can provide configurations for a three-dimensional memory array (3D memory array), and possible methods for operating such a system. An aspect of the present invention provides a 3D memory array including programmable memory cells arranged such that each memory cell is programmable and readable by biasing word lines, bit lines, and conductive plates to different configurations of source voltages.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A phase change memory array comprising:
   a plurality of bottom electrodes;
   a plurality of top electrodes positioned along a bit line direction;
   a plurality of memory pillars, each of the memory pillars including phase change material surrounded by a dielectric casing, the dielectric casing including a casing lip in physical contact with the phase change material, the dielectric casing and casing lip forming an L-shaped cross section defining a space between the dielectric casing and the phase change material, the phase change material positioned between, and in series circuit with, a respective bottom electrode from the plurality of bottom electrodes and a respective top electrode from the plurality of top electrodes, and a metallic liner positioned over and in contact with the casing lip and inside the space between the dielectric casing and the phase change material extending vertically from the casing lip along an area defined by the dielectric casing and the phase change material; and
   a continuous layer of unitary selector material positioned parallel lengthwise to the bit line direction and positioned between the memory pillars and the plurality of bottom electrodes, the selector material configured to conduct electricity only when a voltage across the selector material exceeds a voltage threshold; and
   wherein each of the bottom electrodes is physically and electrically isolated from one another by a dielectric substrate and the continuous layer of selector material positioned between the memory pillars and the plurality of bottom electrodes.

2. The phase change memory array of claim 1, wherein the continuous layer of the selector material is in physical contact with each of the plurality of bottom electrodes and each of the plurality of memory pillars.

3. The phase change memory array of claim 1, further comprising a dielectric layer positioned between the memory pillars, the insulating dielectric layer includes central cavities above the continuous layer of selector material.

4. The phase change memory array of claim 1, wherein the metallic liner of each of the memory pillars is in physical contact with a respective one of the plurality of the top electrodes.

5. The phase change memory array of claim 1, wherein the phase change material of each of the memory pillars is electrically connected to the selector material at a bottom of a respective one of the memory pillars.

6. The phase change memory array of claim 1, wherein each of the memory pillars includes a bottom metallic layer positioned between and in physical contact with the phase change material and the selector material.

7. The phase change memory array of claim 1, wherein each of the memory pillars includes a top metallic layer positioned between and in physical contact with the phase change material and a respective one of the plurality of top electrodes.

8. The phase change memory array of claim 1, wherein the phase change material is programmable to one of two different resistance levels for a single-level cell (SLC) and one of at least three different resistance levels for a multi-level cell (MLC).

9. The phase change memory array of claim 1, wherein the phase change memory array is a three-dimensional memory array.

10. A phase change memory array comprising:
    a plurality of bottom electrodes;
    a plurality of top electrodes positioned along a bit line direction;
    a plurality of memory pillars, each of the memory pillars including phase change material surrounded by a dielectric casing, the phase change material positioned between, and in series circuit with, a respective bottom electrode from the plurality of bottom electrodes and a respective top electrode from the plurality of top electrodes; and
    a continuous layer of unitary selector material positioned parallel lengthwise to the bit line direction and positioned between the memory pillars and the plurality of bottom electrodes, the selector material configured to conduct electricity only when a voltage across the selector material exceeds a voltage threshold.

11. The phase change memory array of claim 10, wherein the continuous layer of the selector material is in physical contact with each of the plurality of bottom electrodes and each of the plurality of memory pillars.

12. The phase change memory array of claim 10, further comprising a dielectric layer positioned between the memory pillars, the insulating dielectric layer includes central cavities.

13. The phase change memory array of claim 10, wherein each of the memory pillars includes a metallic liner positioned between and in contact with the dielectric casing and the phase change material along a portion of the memory pillars.

14. The phase change memory array of claim 13, wherein the metallic liner of each of the memory pillars is in physical contact with a respective one of the plurality of the top electrodes.

15. The phase change memory array of claim 10, wherein the phase change material of each of the memory pillars is electrically connected to the selector material at a bottom of a respective one of the memory pillars.

16. The phase change memory array of claim 10, wherein each of the memory pillars includes a bottom metallic layer positioned between and in physical contact with the phase change material and the selector material.

17. The phase change memory array of claim 10, wherein each of the memory pillars includes a top metallic layer positioned between and in physical contact with the phase change material and a respective one of the plurality of top electrodes.

18. The phase change memory array of claim 10, wherein the phase change material is programmable to one of two different resistance levels for a single-level cell (SLC) and one of at least three different resistance levels for a multi-level cell (MLC).

19. The phase change memory array of claim 10, wherein the phase change memory array is a three-dimensional memory array.

* * * * *